United States Patent
Oh et al.

(10) Patent No.: US 7,352,247 B2
(45) Date of Patent: Apr. 1, 2008

(54) TRIPLE CASCODE POWER AMPLIFIER OF INNER PARALLEL CONFIGURATION WITH DYNAMIC GATE BIAS TECHNIQUE

(75) Inventors: Hyoung-Seok Oh, Daejon (KR); Hyun-Kyu Yu, Daejon (KR); Mun-Yang Park, Daejon (KR); Cheon-Soo Kim, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/843,042

(22) Filed: Aug. 22, 2007

(65) Prior Publication Data
US 2007/0285175 A1    Dec. 13, 2007

Related U.S. Application Data

(63) Continuation of application No. 11/267,243, filed on Nov. 4, 2005, now Pat. No. 7,276,976.

(30) Foreign Application Priority Data

Dec. 2, 2004 (KR) .............. 10-2004-0100649
Apr. 22, 2005 (KR) .............. 10-2005-0033742

(51) Int. Cl.
*H03F 3/04* (2006.01)

(52) U.S. Cl. .................... 330/311; 330/310
(58) Field of Classification Search ............. 330/98, 330/150, 302, 310, 311
See application file for complete search history.

(56) References Cited

U.S. PATENT DOCUMENTS 6,137,367 A * 10/2000 Ezzedine et al. .......... 330/311
7,126,428 B2 * 10/2006 Lin et al. .................. 330/311
7,151,410 B2 * 12/2006 Franck et al. ............. 330/264

* cited by examiner

*Primary Examiner*—Henry Choe
(74) *Attorney, Agent, or Firm*—Ladas & Parry LLP (57) ABSTRACT

Provided is a power amplifier which fits to a deep-submicron technology in radio frequency wireless communication. The power amplifier includes a cascode including a first transistor which receives and amplifies an input signal, and a second transistor which is connected to the first transistor in series and operated by a DC bias voltage; a third transistor which is connected between the cascode and an output end, operated by a dynamic gate bias and outputting a signal; and a voltage divider which includes first and second capacitors that are connected between the output end, i.e. a drain of the third transistor, and a ground in series, and provides the dynamic bias to a gate of the third transistor.

18 Claims, 8 Drawing Sheets

TRIPLE CASCODE POWER AMPLIFIER OF INNER PARALLEL CONFIGURATION WITH DYNAMIC GATE BIAS TECHNIQUE

CROSS-REFERENCE TO RELATED APPLICATION

This application is a continuation of U.S. application Ser. No. 11/267,243, now U.S. Pat. No. 7,276,976, filed on Nov. 04, 2005.

FIELD OF THE INVENTION

The present invention relates to a power amplifier; and, more particularly, to a power amplifier which fits to a deep-submicron technology in wireless communication based on a radio frequency.

DESCRIPTION OF RELATED ART

Rapid development of technologies makes it possible to produce diverse chips used for wireless communication at a low price by using a Complementary Metal Oxide Semiconductor (CMOS) process, and achieve almost the same performance compared with chips produced by using conventional III-V group compound semiconductor.

Recent development of a CMOS manufacturing process makes the length of a channel of a CMOS transistor getting short. Accordingly, high frequency performance has been expected to be improved continuously. However, the shorter the length of the CMOS transistor channel is, the thinner a gate silicon dioxide film of the transistor becomes, which causes a problem that a breakdown voltage (BV) between a gate and a drain is lowered.

Meanwhile, a voltage swing becomes two times, e.g., linear amplifiers of Class-A, AB and B, or more than three times, e.g., a switching amplifier of Class-E, of supply voltage at the drain node of a power amplifier. Therefore, along with the development of a CMOS manufacturing process, the shorter a minimum channel of a transistor is, the lower a usable supply voltage becomes. This makes it difficult to design a high power amplifier.

For the purpose of solving the above problem, a method of realizing the power amplifier by using an input/output transistor of a thick gate oxide instead of a transistor having the minimum channel length was suggested, while the transistor of the minimum channel length is used for other circuits except the power amplifier. The method of realizing the power amplifier using the input/output transistor has an advantage that it can increase the level of output power by increasing the usable direct current (DC) supply voltage, but it also causes a problem that a high frequency characteristic such as a power gain degrades since the input/output transistor is formed of a relatively thick gate silicon dioxide film.

Figure 1:
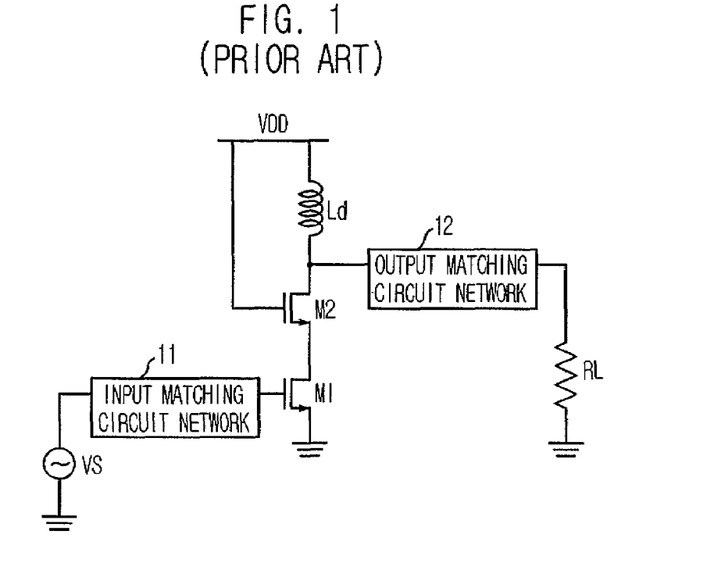
FIG. 1 is a circuit diagram showing a conventional power amplifier having a cascode configuration.

Realizing the power amplifier as a cascode configuration is one of methods for increasing the output power by increasing usable DC supply voltage. As shown in FIG. 1, the cascode has a configuration where a common gate transistor M2 and a common source transistor M1 are connected in series.

The common gate transistor M2 is connected between an inductor Ld, which is connected to a DC supply voltage source, and a common source transistor M1. Also, the gate bias of common gate transistor M2 is supplied by the DC supply voltage source. The common source transistor M1 is connected between the common gate transistor M2 and ground. A radio frequency (RF) input signal Vs is coupled to the gate through an input matching circuit network 11. Meanwhile, an output matching circuit network 12 is connected between the load and the drain node of common gate transistor M2. The output matching circuit network 12 performs the impedance matching on the signal from the output end between the inductor Ld and the drain of common gate transistor M2.

In the structure, the larger the amplitude of the input signal Vs is, the larger the voltage stress between the gate and drain of the common gate transistor M2 becomes compared with the voltage between the gate and drain of the common source transistor M1. Thus, a breakdown phenomenon occurs in the common gate transistor M2. To solve the problem, there has been an attempt to substitute the common gate transistor M2 with the input/output transistor, but efficiency is very low since it also generates a problem of deteriorated high frequency characteristic. Therefore, while using a transistor with a minimum channel length for good high frequency characteristic such as high power gain, it is required to solve a low breakdown voltage problem between a gate and a drain.

Meanwhile, modulation methods such as Quadrature Phase Shift Keying (QPSK), Quadrature Amplitude Modulation (QAM), and Code Division Multiple Access (CDMA), which perform phase and amplitude modulation simultaneously, are used for a high data transmission rate and the effective use of a frequency band in recent wireless communication environment. In this case, linearity becomes a very important performance factor, and a linear power amplifier is operated in a Class-AB mode due to a tradeoff relationship between the linearity and the efficiency. However, the efficiency of a linear power amplifier is maximized when the output power of the amplifier is a maximum. The lower the output of the amplifier is, the less efficient the linear power amplifier becomes. As a result, the efficiency of the power amplifier is substantially degraded in a communication environment that the power amplifier should be used with a backoff in the range of 0 to 10 dB from its maximum output due to linearity.

Two methods for solving the above mentioned problems have been suggested earlier. One increases the efficiency by lowering a bias voltage in a low power mode and hence decreasing a bias current. This method decreasing DC power consumption by lowering the bias voltage increases the efficiency of the power amplifier in the low power mode, but it has a problem that as the bias voltage is lowered, the linearity gets worse. The other method connects a high power amplifier and a low power amplifier in parallel, and selects an adequate amplifier out of the two amplifiers according to each mode.

Figure 2:
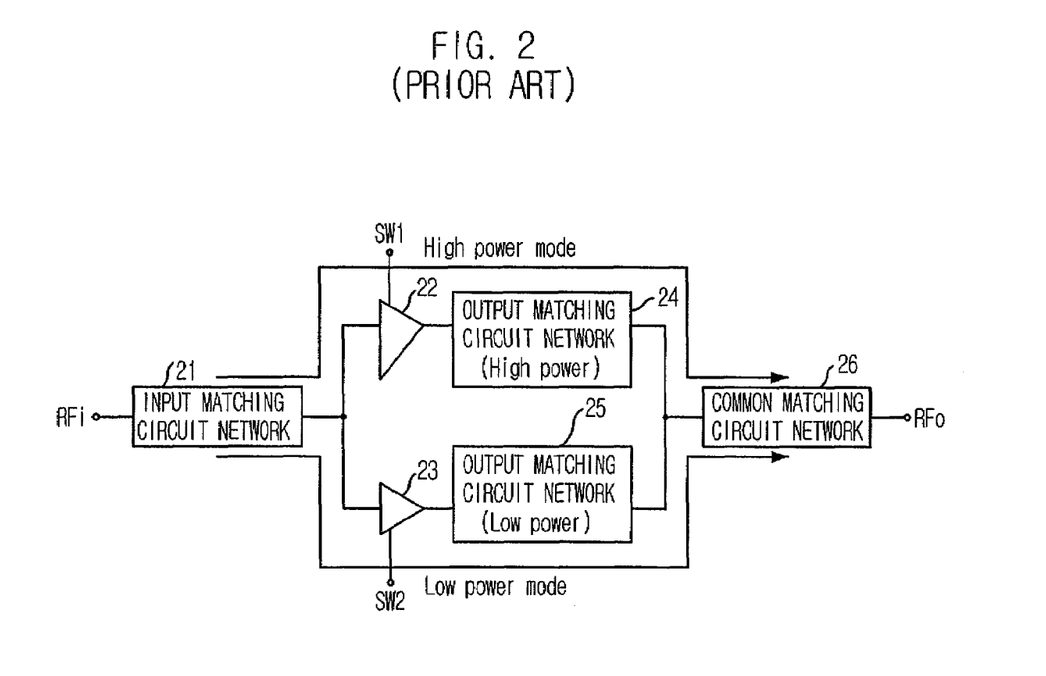
FIG. 2 is a block diagram illustrating an operation principle of the power amplifier of FIG. 1 formed in parallel.

As shown in FIG. 2, when the amplifiers of each power mode are connected in parallel, each of output matching circuits 24 and 25 or transmission lines are required. Using the transmission line as an output matching circuit network is desirable in the respect that each mode can be independently operated, but it causes a problem that it is not easy to integrate the transmission line. When an output matching circuit network is made of passive elements, it is difficult to isolate the power amplifiers 22 and 23 from each other, and the passive elements also decrease the output power and efficiency. Also, since an input/output impedance of the power amplifier is changed according to the on/off state of each mode power amplifier 22 or 23, an input/output matching state fluctuates. An additional matching circuit may be required to compensate the change of the input/output impedance, which reduces the output power and efficiency, and raises costs.

SUMMARY OF THE INVENTION

It is, therefore, an object of the present invention to provide a power amplifier which does not deteriorate characteristics of a high frequency, and can increase power gain and output power by solving a problem of a low breakdown voltage of a deep submicron transistor.

It is another object of the present invention to provide a power amplifier which does not deteriorate the input/output matching state and linearity, and can increase efficiency in a low power mode simultaneously.

In accordance with an aspect of the present invention, there is provided a power amplifier, including: a cascode including a first transistor which receives and amplifies an input signal, and a second transistor which is connected to the first transistor in series and operated by a DC bias voltage; a third transistor which is connected between the cascode and an output end, operated by a dynamic gate bias and outputting a signal from the second transistor to the output end after re-amplification; and a voltage divider which includes first and second capacitors that are connected in series between the output end, which is the drain node of the third transistor, and ground, where the gate of the third transistor is connected to a mid area between the two capacitors, and provides the dynamic gate bias to the gate of the third transistor by distributing an output signal from the drain of the third transistor to the first and second capacitors.

In accordance with another aspect of the present invention, there is provided a power amplifier, including: an amplifying block with N transistors connected in parallel to receive and amplify an input signal individually; a switching transistor that forms a cascode configuration by being connected to each transistor in the amplifying block in series; N cascode blocks in parallel where each cascode block is composed of one amplifying and one switching transistor in series; a dynamic bias transistor connected in series between the switching block and an output end, and that re-amplifies and outputs a signal from the switching block to the output end; and a voltage divider which includes first and second capacitors that are connected in series between the output end, which is the drain node of the third transistor, and ground, where the gate of the third transistor is connected to a mid area between the two capacitors, and provides the dynamic gate bias to the gate of the third transistor by distributing an output signal from the drain of the third transistor to the first and second capacitors.

The preferred embodiments of the present invention will be described in detail hereinafter with reference to the attached drawings so that those skilled in the art that the present invention is included can embody the technological concept and scope of the invention easily. Meanwhile, hereinafter, the same drawing code of described drawing codes is a same element performing a same function.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

FIRST EMBODIMENT

Figure 3:
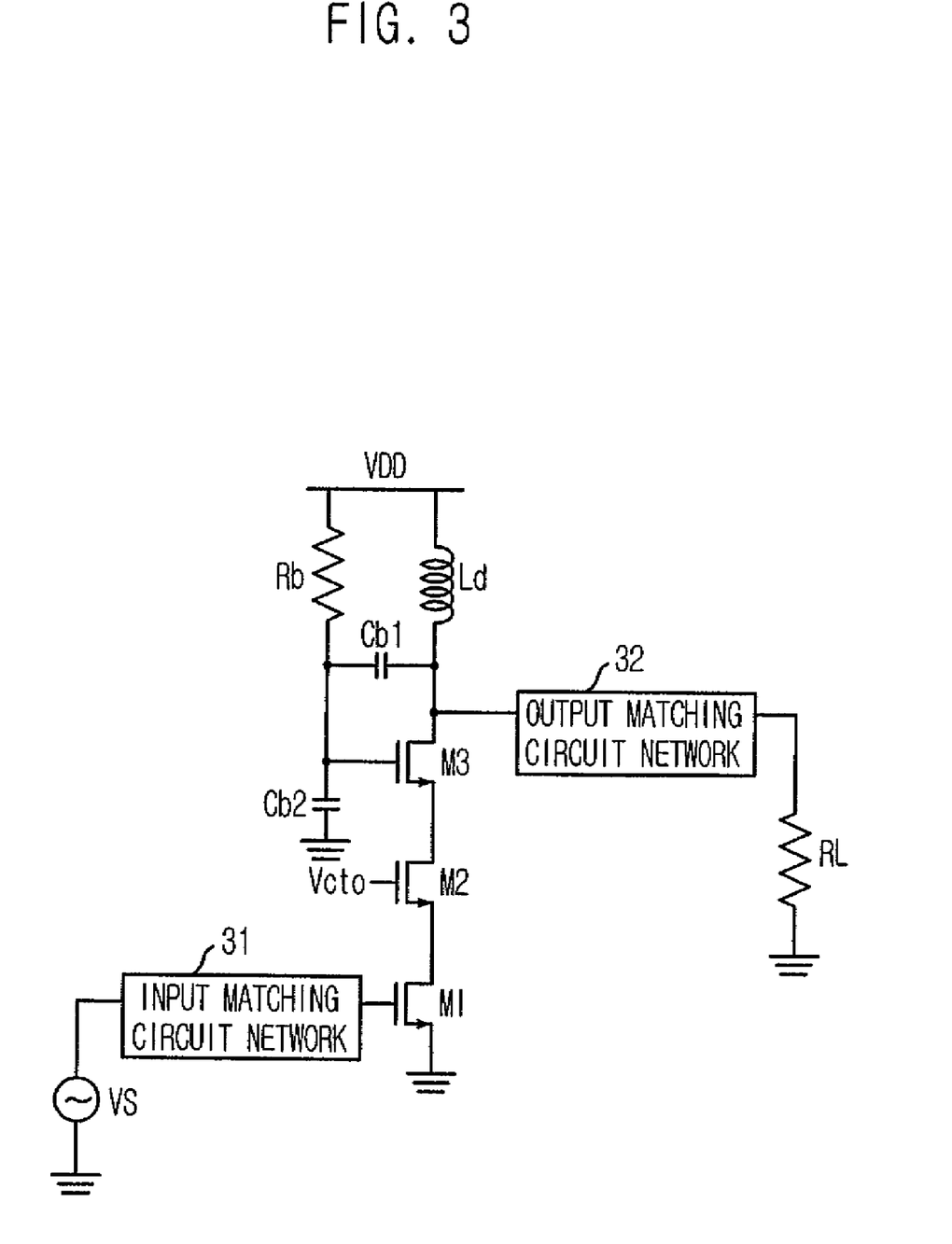
FIG. 3 is a circuit diagram showing a power amplifier in accordance with a first embodiment of the present invention.

FIG. 3 is a circuit diagram showing a power amplifier in accordance with a first embodiment of the present invention.

As shown in FIG. 3, the power amplifier suggested in the first embodiment of the present invention has a triple cascode configuration including a dynamic gate bias by a voltage divider with capacitors Cb1 and Cb2. The triple cascode configuration is formed based on a serial connection of a common source transistor M1, a common gate transistor M2, and a transistor M3 with a dynamic gate bias.

The common source transistor M1, which is the first stage of the triple cascode configuration, is connected to ground at a source, connected to the source of the common gate transistor M2 at a drain, and connected to the input matching circuit network 31 at a gate. Considering the mentioned configuration, an input signal Vs impedance-matched through the input matching circuit network 31 is coupled to the gate of a common source transistor M1, amplified and outputted to the source of a common gate transistor M2. A gate bias circuit of the common source transistor M1 is not shown in FIG. 3.

The common gate transistor M2, which is the second stage, is connected to the drain of the common source transistor M1 at the source, and connected to the source of the dynamic bias transistor M3 at the drain. The common gate transistor M2 works in accordance with the control signal Vct inputted to the gate and functions as a switching element connecting the drain of the common source transistor M1 with the source of the dynamic bias transistor M3 electrically. Herein, the control signal Vct is a voltage signal having a high level, i.e., On-state, or a low level, i.e., Off-state.

The dynamic bias transistor M3, which is the third stage, is connected to the DC supply voltage VDD through an inductor Ld at the drain, and simultaneously connected to a load RL of the amplifier through an output matching circuit network 32. Also, the gate is connected to the DC supply voltage source through a relatively high resistance Rb and simultaneously connected to ground through the capacitor Cb2. Also, the drain and the gate are connected to each other through the Cb1.

The dynamic gate bias is provided to the gate of the dynamic bias transistor M3 by the capacitance ratio of two capacitors Cb1 and Cb2. The dynamic gate bias by the capacitors Cb1 and Cb2 provides stable bias against a process variation and a temperature change to the gate. Generally, capacitance can be changed about 20% by the process variation and also changed according to the temperature in a power amplifier which generates much heat. However, when two capacitors Cb1 and Cb2 are positioned very close to each other, just as shown in the first embodiment of the present invention, the absolute values of the capacitors can be changed according to a process and temperature, but the ratio of two capacitances are hardly changed, thereby providing a stable dynamic gate bias.

The voltages between the gates and drains of the three transistors M1, M2 and M3 can be equally formed by properly adjusting the capacitance ratio of capacitors Cb1 and Cb2 and a gate bias of the common gate transistor M2. Accordingly, without a breakdown problem, a higher DC supply voltage can be used, and a higher level of output power can be obtained. From this, since a voltage swing is larger in the drain of the dynamic bias transistor M3 with respect to the same output power, an output current becomes small and efficiency increases as the power consumption by parasitic elements of an amplifier and a matching circuit is reduced.

Meanwhile, since the gate of the common gate transistor M2 can be operated as a switching element through a control signal Vct, it is possible to turn on/off the power amplifier through a switching operation of the common gate transistor M2 instead of turning on/off a bias of the power amplifier in a Time Division Multiple Access (TDMA) method. In this case, there is an advantage that the settling time of power amplifier can be shortened in comparison with switching the bias.

SECOND EMBODIMENT

Figure 4:
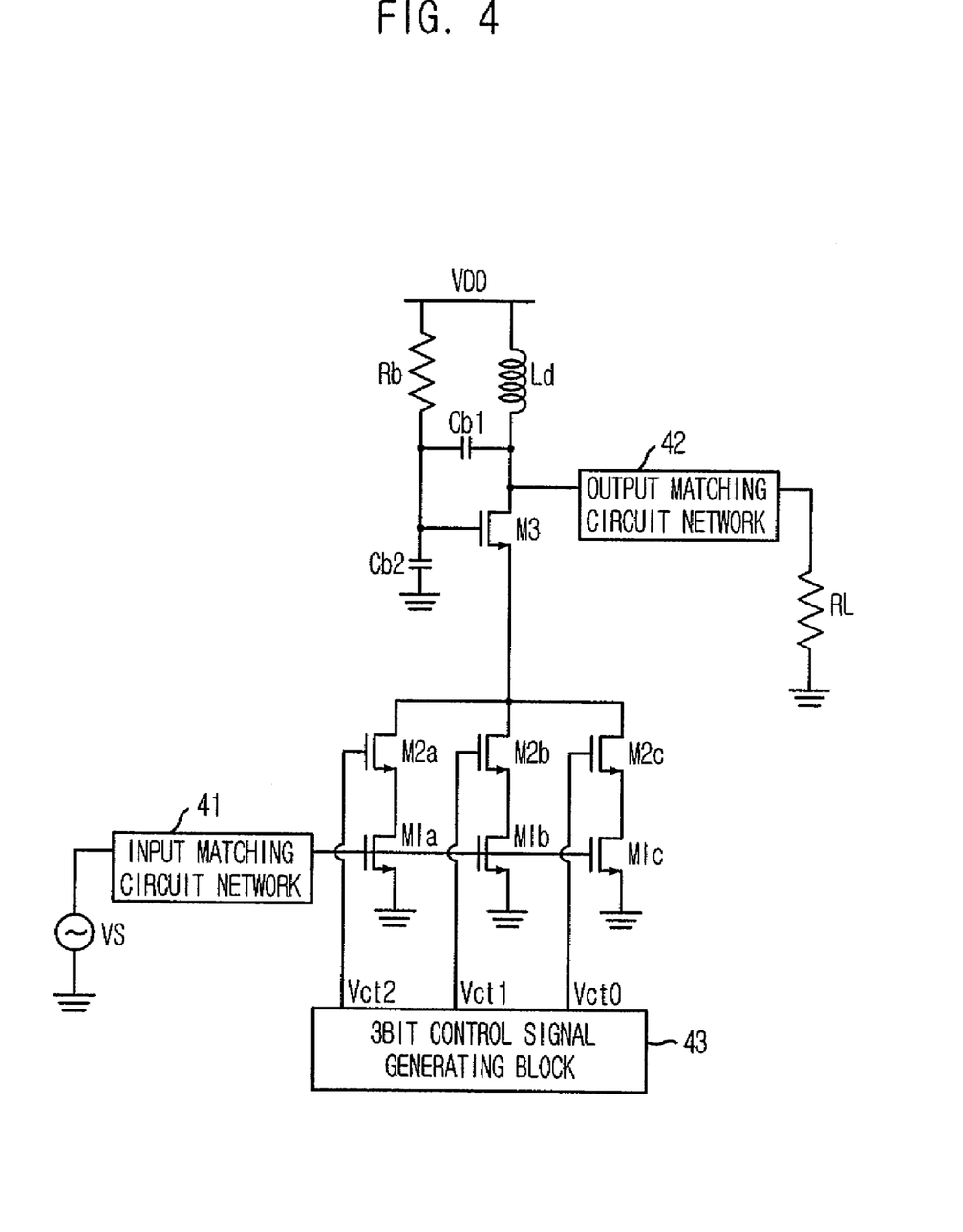
FIG. 4 is a circuit diagram showing a power amplifier in accordance with a second embodiment of the present invention.

FIG. 4 is a circuit diagram describing the power amplifier suggested in the second embodiment of the present invention. It shows an example realizing a triple cascode power amplifier of the first embodiment in inner-parallel configuration.

As shown in FIG. 4, the power amplifier suggested in the second embodiment of the present invention has a configuration that three common gate transistors M2a to M2c and three common source transistors M1a to M1c are connected in parallel cascode configuration in addition to the configuration of the first embodiment. Herein, the number of the cascode branches, which are connected in parallel, is three, but the number is only for the sake of convenience in explanation and it can be varied properly.

The power amplifier of the second embodiment has a configuration for increasing efficiency in a low power mode while taking the advantages of the power amplifier of the first embodiment. In the configuration, cascode branches that three transistors are connected in parallel are connected in serial to one large dynamic bias transistor M3 having a dynamic gate bias and forms a triple cascode circuit.

Bias current of the power amplifier is controlled according to each output mode by using 3-bit control signals Vct0 to Vct2 provided from the 3-bit control signal generating block 43. Herein, bias current is controlled by turning on/off each cascode branch based on the 3-bit control signals Vct0 to Vct2. Bias voltage is still maintained within a linear region, and bias current is controlled by controlling an effective width of the power amplifier, thereby having superior linearity in comparison with conventional bias voltage control methods.

DC power consumption can be reduced by operating a part of three cascode branches, i.e., a part of the common gate transistors M2a to M2c based on the 3-bit control signals Vct0 to Vct2 in a low power mode, thereby increasing power efficiency remarkably. An on/off operation of each cascode branch is performed through on/off operation of the common gate transistors M2a to M2c included in the cascode branches. The common source transistors M1a to M1c and the dynamic bias transistor M3 maintains the same bias regardless of the on/off operation. Therefore, when a cascode branch is turned on/off according to each output mode, input/output impedance of a power amplifier core is changed very little. As a result, input/output matching can be maintained in good conditions in all output modes. That is, the present invention presents a configuration of a parallel amplifier amplifying a signal in parallel according to each output mode, but it can solve problems generated in switching of each output mode by realizing a parallel configuration in the inside of the power amplifier. Herein, the on/off state of a cascode branch means a state of a current route formed in each cascode branch according to the operation state of transistors M2a to M2c. That is, the on state signifies that the current route is formed, and the off state signifies that the current route is blocked. When on/off of a cascode branch is mentioned hereinafter, it will be understood as above.

Also, an impedance seen into a drain end of the dynamic bias transistor M3 through an output matching circuit network 42 according to bias current is varied in the power amplifier of the second embodiment For instance, when the bias current is at a minimum level, the impedance seen into the drain end of the dynamic bias transistor M3 is varied maximally. When the bias current is at a maximum level, the impedance is varied minimally. Herein, when only one of the transistors M2a to M2c is turned on, the bias current becomes the minimum. The turned-on transistor has the shortest width among the other transistors. Also, when all transistors M2a to M2c are turned on, the bias current becomes the maximum.

Meanwhile, the power amplifier suggested in the second embodiment of the present invention forms three parallel cascode branches as one embodiment, but the number of the parallel cascode branch can be extended into N numbers, if necessary. Also, the ratio between the widths of the transistors forming the branch can be set up at a predetermined value.

Operation characteristics of each output mode in the power amplifier of the second embodiment of the present invention, which is shown in FIG. 4, will be described hereinafter with reference to FIGS. 5A, 5B, 6A and 6B.

First, operation characteristics in a high power mode will be described with reference to FIGS. 5A and 5B.

Figure 5A:
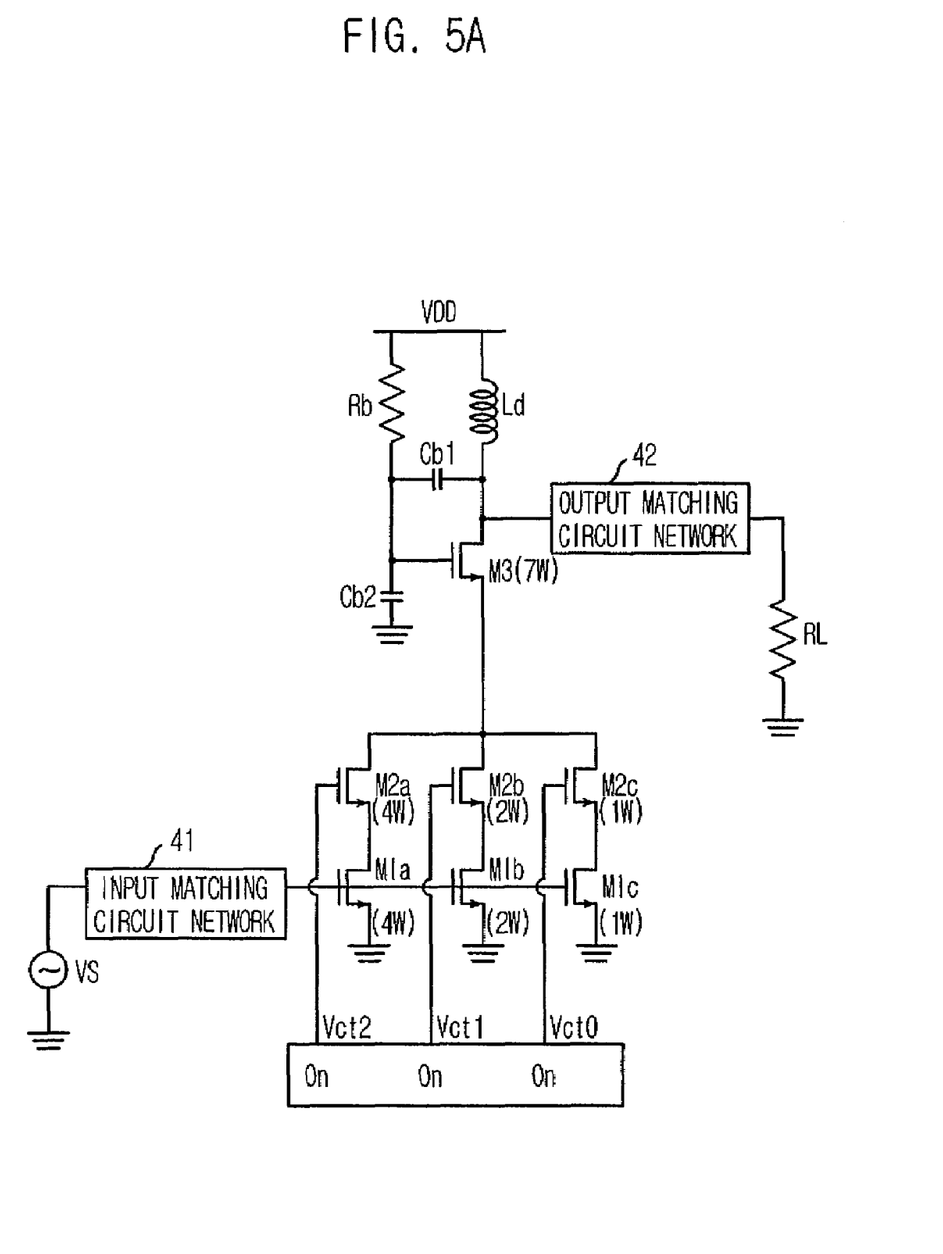
FIGS. 5A and 5B are circuit diagrams for illustrating operation characteristics of the power amplifier in the second embodiment shown in FIG. 4 at a maximum output mode.

As shown in FIG. 5A, all 3-bit control signals Vct0 to Vct2 are set up at a logical high-level 1 in a high power mode. Accordingly, all common gate transistors M2a to M2c are turned on, the dynamic bias transistor M3 and each common source transistors M1a to M1c are connected through the common gate transistors M2a to M2c, respectively. Consequently, it is possible to gain high power since all of the three cascode branches are turned-on.

Figure 5B:
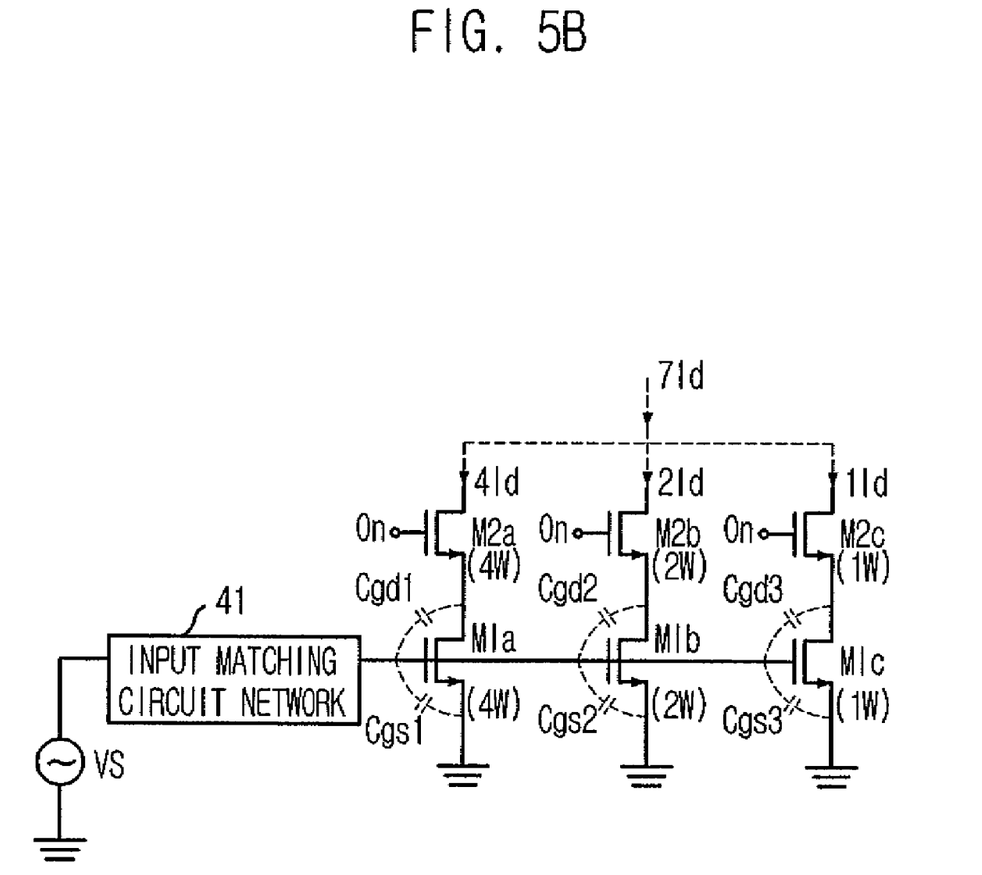

FIG. 5B shows an input impedance and current distribution of the power amplifier in the high power mode shown in FIG. 5A. Referring to FIG. 5B, when the widths of the common gate transistors M2a to M2c and the common source transistors M1a to M1c of the cascode branches are $2^2W$, $2^1W$ and $2^0W$, respectively, current flowing through a source of the dynamic bias transistor M3 is distributed at a ratio corresponding to the widths. For example, as shown in FIG. 5B, when the current flowing through the dynamic bias transistor M3 is 7Id, drain current is 4Id at the transistor M2a, 2Id at the transistor M2b and 1Id at the transistor M2c.

A core impedance of the power amplifier in accordance with the second embodiment is determined by a capacitance Cgs between a gate and a source of a common source transistor of a first stage, and a capacitance Cgd between a gate and a drain. That is, the input capacitance can be expressed as the following equation 1.

$$C_{in\_HPM} = (2^N - 1)\{C_{gs} + C_{gd}(1 + |A_{v1}|)\} \qquad \text{Eq. 1}$$

In above equation 1, 'N' is the number of parallel cascode branches, i.e., the number of transistors, and 'Cgs' is a capacitance between a gate and a source of the first end of a cascode branch having a transistor width of $2^0$W. 'Cgd' is a capacitance between the gate and the drain, and 'Av1' is a voltage gain between the gate and the drain of the first stage of the cascode branch.

Meanwhile, operation characteristics of a low power mode will be described referring to FIGS. 6A and 6B.

Figure 6A:
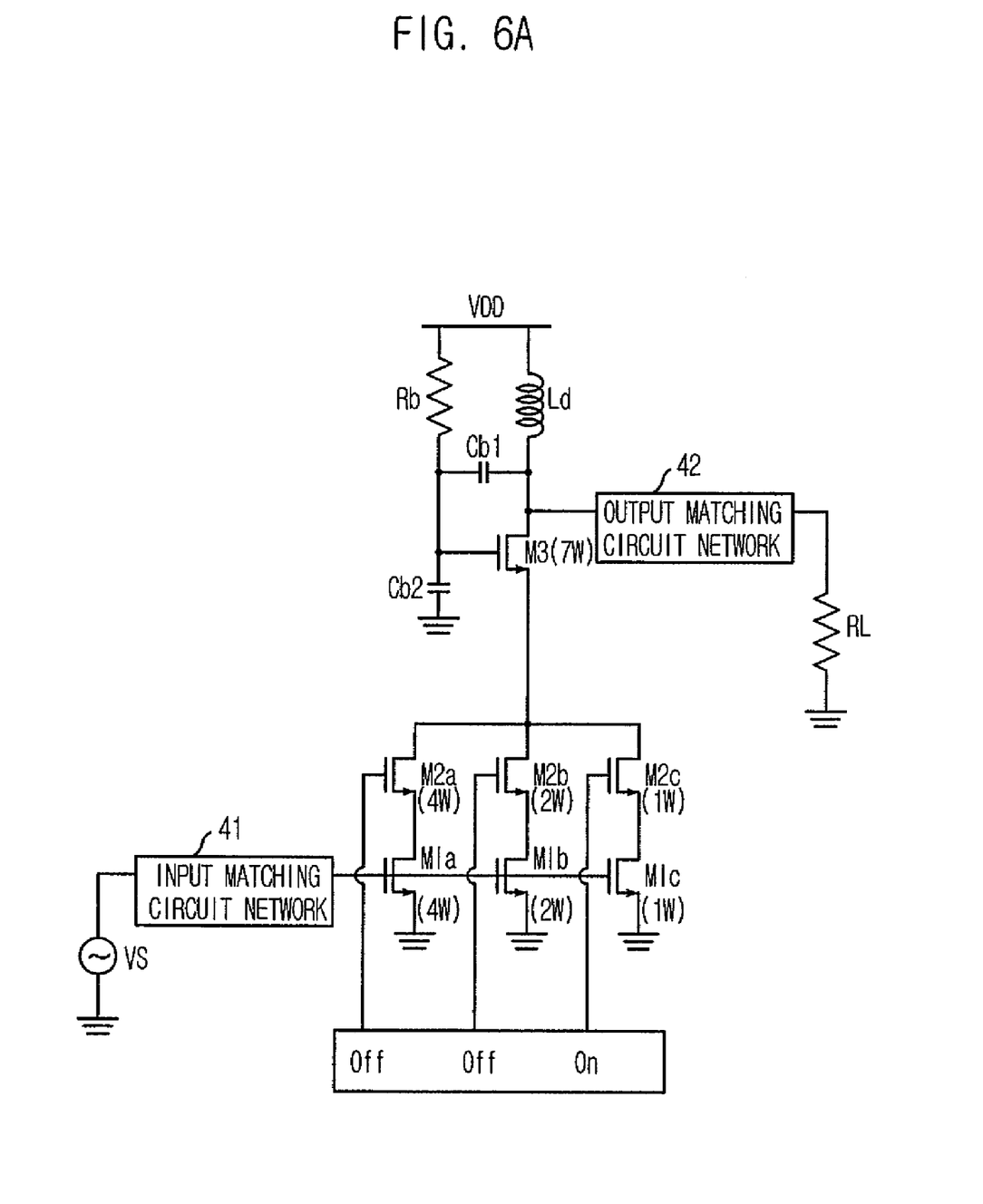
FIGS. 6A and 6B are circuit diagrams for illustrating operation characteristics of the power amplifier of the second embodiment shown in FIG. 4 at a minimum output mode.

As shown in FIG. 6A, in a low power mode, all control signals Vct1 and Vct2 excluding a control signal Vct0 among 3-bit control signals Vct0 to Vct2 are set up at a mode logical low level 0. Accordingly, only the common gate transistor M2c of the common gate transistors M2a to M2c is turned on, and only the dynamic bias transistor M3 and the common source transistor M1c are connected through the common gate transistor M2c which is turned on. As a result, only the first cascode branch of the three cascode branches maintains the on-state, thereby gaining a low power.

Figure 6B:
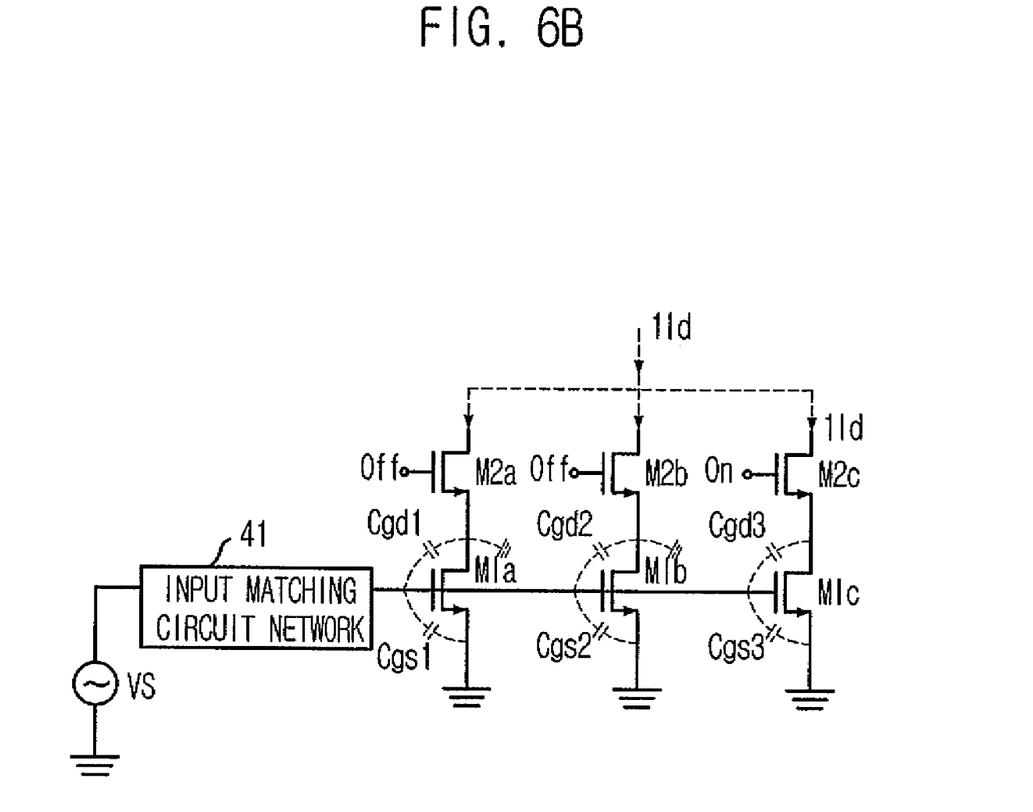

FIG. 6B shows an input impedance and current distribution of the power amplifier in a low power mode shown in FIG. 6A. Current flows through a cascode branch maintaining the on-state by an operation of the transistors M2c. However, since the common source transistors M1a and M1b of the cascode branches maintaining the off-state by transistors M2a and M2b which are turned-off are still in the same bias state, a transistor channel is formed. Drain nodes of the common source transistors M1a and M1b in the turned-off cascode branches are connected to the ground through the formed channel. Therefore, an input capacitance can be expressed as the following equation 2.

$$C_{in\_LPM} = (2^N - 1)(C_{gs} + C_{gd}) + C_{gd}|A_{v1}| \qquad \text{Eq. 2}$$

When the equation 1 is compared with the equation 2, a variation rate of an input capacitance in a highest power mode and in a lowest power mode can be shown as the following equation 3.

$$\Delta(\%) = \frac{100(2^N - 2)C_{gd}|A_{v1}|}{(2^N - 1)\{C_{gs} + C_{gd}(1 + |A_{v1}|)\}} < \frac{100 C_{gd}|A_{v1}|}{C_{gd} + C_{gd}(1 + |A_{v1}|)} \qquad \text{Eq. 3}$$

Since a Miller effect is not large in a cascode configuration and a value of 'Cgd' with respect to 'Cgs' is not large, the variation rate of the input capacitances according to each output mode is very small. Therefore, an input matching state according to each output mode is maintained in the good state.

Since the transistor of the third stage in the power amplifier maintains a predetermined level of bias regardless of each output mode, an output impedance can be analyzed similarly to the input impedance and the variation rate is also very small. As a result, the output matching state according to each output mode is continuously maintained in the good state.

THIRD EMBODIMENT

Figure 7:
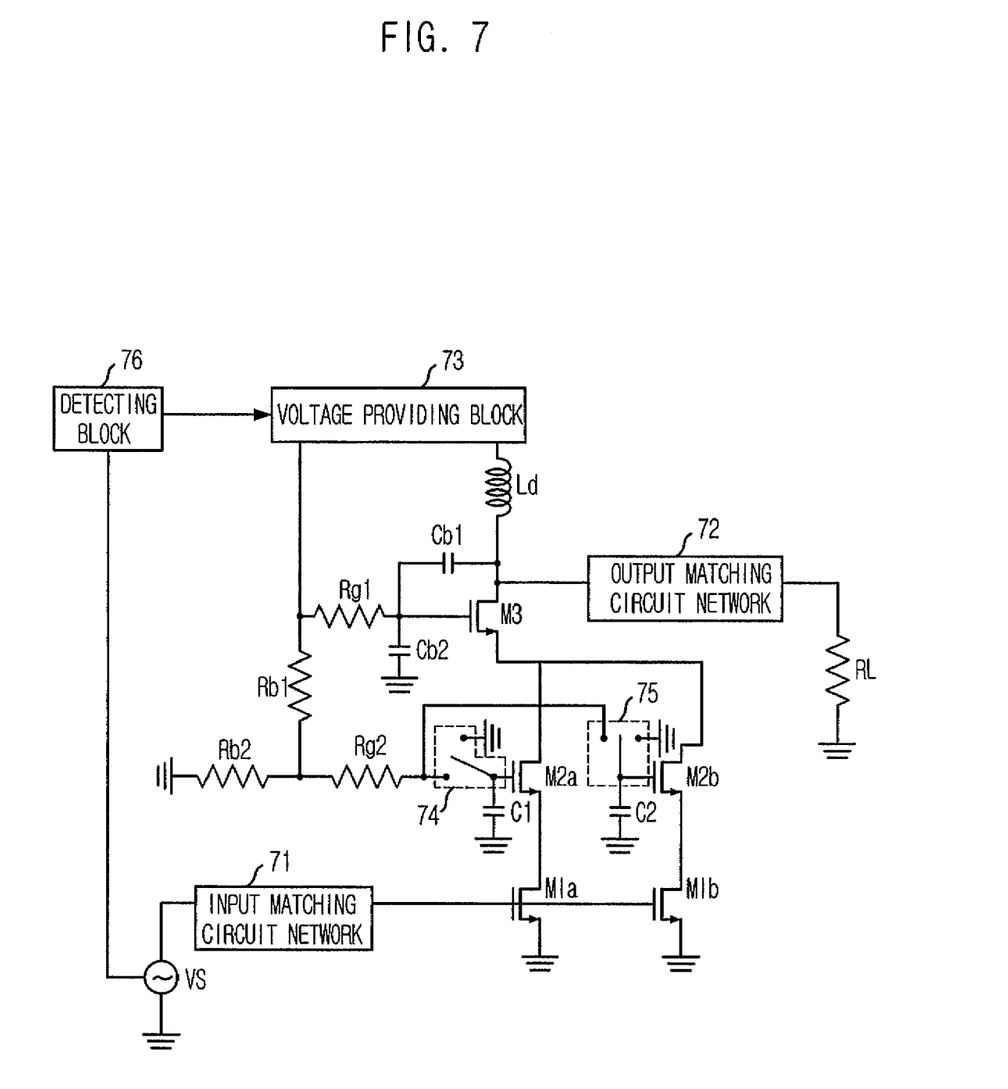
FIG. 7 is a circuit diagram showing a power amplifier in accordance with a third embodiment of the present invention.

FIG. 7 is a circuit diagram showing a power amplifier in accordance with a third embodiment of the present invention. Herein, the power amplifier having dynamic bias current and dynamic bias voltage in accordance with a third embodiment of the present invention is an example originated from the power amplifier in accordance with the second embodiment shown in FIG. 4.

As shown in FIG. 7, the power amplifier of the third embodiment further includes a detecting block 76 for detecting the amplitude of an input signal Vs in the power amplifier shown in FIG. 4 and a voltage providing block 73 for controlling an amplitude of DC supply voltage according to a control signal of the detecting block 76.

In the respect of a bias, a DC gate bias of the dynamic bias transistor M3 in the third stage is determined to be equal to a dynamic supply voltage and a dynamic gate bias according to the amplitude of an output signal is determined by a voltage divider of capacitors Cb1 and Cb2 around the DC gate bias. A DC bias of a second stage is determined by an impedance ratio of resistances Rb1 and Rb2. Since each bias is determined based on a capacitance ratio of the capacitors Cb1 and Cb2 and the impedance ratio of the resistances Rb1 and Rb2, the bias is stable with respect to the process and temperature variations.

In each cascode branch, a current path is blocked or formed by switching elements 74 and 75. Herein, the switching elements 74 and 75 can be properly formed by using a MOS transistor.

A gate of the dynamic bias transistor M3 in a third stage of the cascode branch is connected to a gate resistance Rg1. Also, each gate of transistors M2a and M2b in the second stages is separately connected to capacitors C1 and C2 for providing a virtual ground, and connected to either a gate resistance Rg2 or a ground. Also, each gate of transistors M1a and M1b in the first stage is connected to an input matching circuit network 71.

Meanwhile, the power amplifier of the third embodiment can use the detecting block 76 to receive a proper supply voltage through the voltage supply block 73 according to an input signal Vs. Also, the power amplifier of the third embodiment receives a control signal from a baseband Digital Signal Processor (DSP) and can control supply voltage in stages. Herein, the control signal from the DSP can be also used as a control signal of switching elements 74 and 75 of a cascode branch. The amplitude of the supply voltage is controlled according to the amplitude of the input signal Vs. The controlled supply voltage provides the controlled DC bias to a gate of each transistor M2a, M2b and M3 included in the second and third stages based on the impedance ratio of the resistances Rb1 and Rb2. Meanwhile, the bias current is controlled through the on/off of a cascode branch of the power amplifier in accordance with the second embodiment shown in FIG. 4.

As described above, entire power efficiency can be maximized by controlling the bias voltage and the bias current in separately or simultaneously in the preferred embodiments of the present invention. Moreover, power efficiency can be maximized by controlling the bias voltage and the bias current without deteriorating the linearity and the input/output matching state. Although only a single-ended type of power amplifier is described in the preferred embodiments of the present invention for the sake of convenience in description, it is also possible to realize a differential power amplifier by symmetrically connecting two power amplifiers of the present invention shown in FIG. 3 and FIG. 4.

As described above, the power amplifier of the present invention has a triple cascode configuration that three transistors are connected in series, and the voltage between a gate and a drain of each transistor is equally controlled by using the capacity divider. This makes it possible to use a higher level of DC supply voltage without causing the breakdown phenomenon while using a standard transistor of a minimum channel length with a superior high frequency characteristic such as power gain. Accordingly, it is also possible to obtain a higher level of output power.

Also, the present invention provides a stable bias against variation in process and temperature by using the capacitor divider as a dynamic bias circuit of the dynamic bias transistor included in a cascode configuration, thereby preventing a breakdown problem, which can be generated when a dynamic bias distribution rate is changed due to the variation in process and temperature.

Also, the present invention includes the common gate transistor functioning as a switching element between the dynamic bias transistor and the common source transistor in the cascode configuration, thereby controlling the operation of the power amplifier. Accordingly, the present invention can reduce settling time of the power amplifier in comparison with controlling the operation by a bias circuit.

Also, the present invention forms the inner parallel triple cascode configuration by connecting cascode branches of the first and second transistors in parallel in a triple cascode configuration, and reduces DC current in a low power mode by controlling an effective channel width of the amplifier in a parallel cascode configuration, thereby increasing the efficiency of the power amplifier without deteriorating the linearity. Also, the input/output matching state can be maintained at a predetermined level in a fine state according to each mode by controlling each parallel amplification path of signal according to each output mode through the on/off switching operation. The efficiency of the power amplifier can be optimized by controlling the bias voltage and the bias current according to the input signal.

The present application contains subject matter related to Korean patent application Nos. 2004-0100649 and 2005-0033742 filed with the Korean Intellectual Property Office on Dec. 2, 2004, and Apr. 22, 2005, respectively, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A power amplifier, comprising:
an amplifying block with N transistors connected in parallel to receive and amplify an input signal individually;
a switching block that forms a cascode configuration by being connected to the amplifying block in series and that N transistors serially connected to each transistor in the amplifying block are connected in parallel;
a dynamic bias transistor that is operated by a dynamic gate bias by being connected in series between the switching block and an output end, and that reamplifies and outputs a signal coming from the switching block to the output end; and
a voltage dividing block that includes first and second capacitors connected in series between the output end and an ground, and that allots output signals through the first and second capacitors and provides the dynamic gate bias to a gate of the dynamic bias transistor.

2. The power amplifier as recited in claim 1, wherein the N transistors in the switching block are independently operated by N control signals, thereby controlling an effective channel width and bias current for each output mode.

3. The power amplifier as recited in claim 1, wherein the first capacitor is connected between the output end and a gate of the dynamic bias transistor, and the second capacitor is connected between the gate of the dynamic bias transistor and the ground.

4. The power amplifier as recited in claim 1, wherein the dynamic gate bias is determined based on a capacitance ratio of the first and second capacitors.

5. The power amplifier as recited in claim 1, further including:
an input matching circuit network which is for impedance matching of the input signal and connected between an input end that an input signal is received and the gate of the N transistors in the amplifying block.

6. The power amplifier as recited in claim 1, further including:
an output matching circuit network which is for impedance matching of the output signal and connected between an output end i.e. a drain node of a dynamic bias transistor, and an external load.

7. The power amplifier as recited in claim 1, wherein each of the N transistors in the amplifying block separately includes a common source transistor.

8. The power amplifier as recited in claim 1, wherein each of the N transistors in the switching block includes a common gate transistor.

9. The power amplifier as recited in claim 1, wherein a channel width of the N transistors in the amplifying block and the switching block is $2^0 W$ to $2^{(N-1)}W$.

10. The power amplifier as recited in claim 9, wherein the DC bias has $2^N-1$ different steps according to operation of the switching block.

11. The power amplifier as recited in claim 1, wherein an output matching circuit network connected for impedance matching of the output signal between an output end and an external load is further included, wherein the output matching circuit network varies impedance, which is seen from the output end, i.e. a drain node, of the dynamic bias transistor, according to the amplitude of the bias current flowing on the dynamic bias transistor.

12. The power amplifier as recited in claim 1, wherein power efficiency is optimized by selecting one bias current level among the usable DC bias levels through the operation of the switching block according to the amplitude of the input signal.

13. The power amplifier as recited in claim 1, wherein the N control signals are digital signals provided from a baseband Digital Signal Processing (DSP).

14. The power amplifier as recited in claim 1, wherein the dynamic bias transistor is connected to the DC supply voltage source through an inductor and DC bias voltage is provided from the DC supply voltage source to a gate through a resistor.

15. The power amplifier as recited in claim 1, further comprising:
a detecting block for detecting input signals and outputting different control signals according to the amplitude of the input signals;

a voltage providing block for controlling the amplitude of the DC supply voltage according to the control signals of the detecting block and outputting the different DC supply voltage; and first and second bias resistors for dividing the DC supply voltage provided from the voltage providing block according to a resistance ratio by being connected between the voltage providing block and the ground, and providing the divided DC bias voltage to each gate of the transistors in the dynamic bias transistor and the switching block.

16. The power amplifier as recited in claim 15, wherein the DC bias voltage inputted to each gate of the transistors in the dynamic bias transistor and the switching block is determined according to the DC supply voltage provided from the voltage providing block and a resistance ratio of the first and second bias resistors.

17. The power amplifier as recited in claim 16, further comprising:

a first gate resistor connected between the voltage providing block and the gate of the dynamic bias transistor;

a second gate resistor, one end of which is connected to a part where the first and second bias resistors are connected; and N switching elements connecting the second gate resistor with each gate of the N transistors in the switching block.

18. The power amplifier as recited in claim 17, wherein the N switching elements, each of which is a 3-way switch, are connected to the second gate resistor at a first end, connected to a capacitor, which is connected between each gate of the N transistors in the switching block and the ground, at the second end, and connected to the ground at the third end.

* * * * *